（12） United States Patent
Fu et al.

(10) Patent No.: US 10,138,573 B2
(45) Date of Patent: Nov. 27, 2018

(54) AUXILIARY HEATING DEVICE FOR ZONE MELTING FURNACE AND HEAT PRESERVATION METHOD FOR SINGLE CRYSTAL ROD THEREOF

(71) Applicant: ZHEJIANG JINGSHENG M & E CO., LTD, Shangyu (CN)

(72) Inventors: Linjian Fu, Shangyu (CN); Penggen Ouyang, Shangyu (CN); Dantao Wang, Shangyu (CN); Mingjie Chen, Shangyu (CN); Gang Shi, Shangyu (CN); Jianwei Cao, Shangyu (CN); Minxiu Qiu, Shangyu (CN); Qingliang Jiang, Shangyu (CN)

(73) Assignee: ZHEJIANG JINGSHENG M & E CO., LTD, Shangyu, Zhejiang (CN)

( * ) Notice: Subject to any disclaimer, the term of this patent is extended or adjusted under 35 U.S.C. 154(b) by 350 days.

(21) Appl. No.: 14/787,236

(22) PCT Filed: May 16, 2013

(86) PCT No.: PCT/CN2013/075717
§ 371 (c)(1),
(2) Date: Oct. 26, 2015

(87) PCT Pub. No.: WO2014/172929
PCT Pub. Date: Oct. 30, 2014

(65) Prior Publication Data
US 2016/0053401 A1 Feb. 25, 2016

(30) Foreign Application Priority Data
Apr. 25, 2013 (CN) .......................... 2013 1 0149186

(51) Int. Cl.
*C30B 13/20* (2006.01)
*C30B 29/06* (2006.01)
(Continued)

(52) U.S. Cl.
CPC .............. *C30B 13/20* (2013.01); *C30B 13/28* (2013.01); *C30B 13/30* (2013.01); *C30B 29/06* (2013.01); *C30B 29/66* (2013.01)

(58) Field of Classification Search
CPC combination set(s) only.
See application file for complete search history.

(56) References Cited

U.S. PATENT DOCUMENTS 2,932,562 A * 4/1960 Pfann ...................... C30B 13/16
117/46
3,108,169 A * 10/1963 Keller .................... C30B 13/30
148/DIG. 74
(Continued)

FOREIGN PATENT DOCUMENTS

CN 1847468 10/2006
CN 1847468 A 10/2006
(Continued)

OTHER PUBLICATIONS

International Search Report for PCT/CN2013/075717, dated Jan. 20, 2014, and English translation, 6 pages total.
(Continued)

*Primary Examiner* — Erin F Bergner
(74) *Attorney, Agent, or Firm* — Hamre, Schumann, Mueller & Larson, P.C.

(57) ABSTRACT

The present invention aims at providing an auxiliary heating device for a zone melting furnace and a heat preservation method for a single crystal rod thereof. The auxiliary heating device comprises an auxiliary heater disposed below a high-frequency heating coil inside the zone melting furnace and is formed by winding a hollow metal circular pipe. The winding start end of the auxiliary heater is positioned on the upper part, the winding stop end of the auxiliary heating device is positioned on the lower part, and an upper end part and a lower end part are respectively guided out from the both ends; and a hollow cylindrical heating load is disposed on the inner side of the auxiliary heater, and an insulation part is disposed between the heating load and the auxiliary heater. The present invention can solve the problem of single
(Continued)

Figure 1:
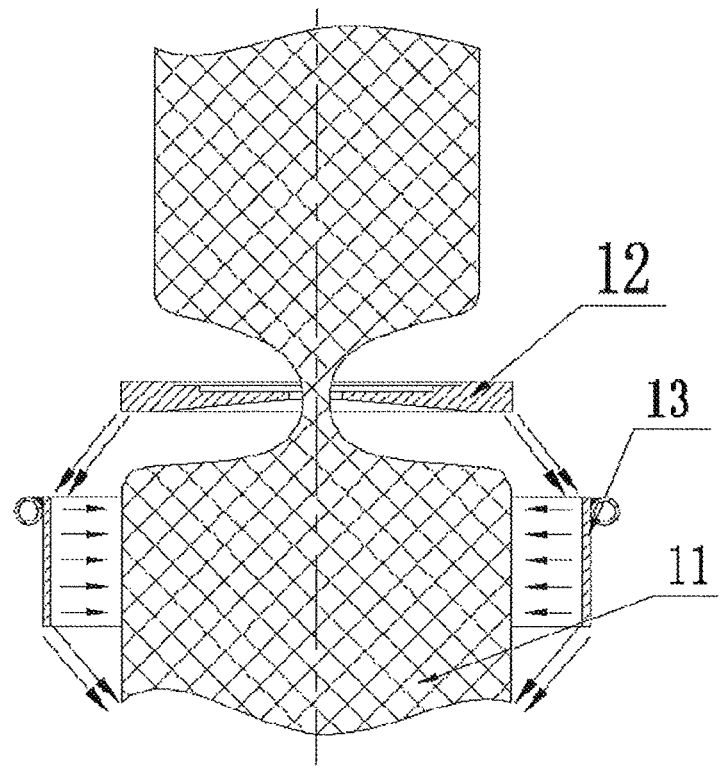

crystal rod cracking caused by unreasonable distribution of the thermal field and overlarge thermal stress in the growth process of zone-melted silicon single crystals over 6.5 inches.

7 Claims, 2 Drawing Sheets

(51) Int. Cl.
    *C30B 13/28*     (2006.01)
    *C30B 13/30*     (2006.01)
    *C30B 29/66*     (2006.01)

(56) References Cited

U.S. PATENT DOCUMENTS

| | | | | |
|---|---|---|---|---|
| 3,258,314 A | * | 6/1966 | Redmond | C30B 13/06 117/222 |
| 3,649,210 A | * | 3/1972 | Keller | C30B 13/16 117/204 |
| 2009/0047203 A1 | * | 2/2009 | Mueller | C30B 11/14 423/348 |

FOREIGN PATENT DOCUMENTS

| | | |
|---|---|---|
| CN | 101775650 | 7/2010 |
| CN | 101775650 A | 7/2010 |
| CN | 102041548 | 5/2011 |
| CN | 102289235 | 12/2011 |
| CN | 102289235 A | 12/2011 |
| CN | 102321913 | 1/2012 |
| CN | 102358951 | 2/2012 |
| CN | 202492612 | 10/2012 |
| CN | 102787350 | 11/2012 |
| CN | 102808216 | 12/2012 |
| CN | 103046122 | 4/2013 |
| CN | 103255473 | 8/2013 |
| CN | 203284497 | 11/2013 |

OTHER PUBLICATIONS

Office Action issued in CN201310176172.X dated Feb. 3, 2015.
Office Action issued in CN201310176172.X dated Aug. 6, 2015.
Office Action issued in CN201310176172.X dated Dec. 3, 2015.
Notification of Allowance issued in CN201310176172.X dated Apr. 6, 2016.

* cited by examiner

AUXILIARY HEATING DEVICE FOR ZONE MELTING FURNACE AND HEAT PRESERVATION METHOD FOR SINGLE CRYSTAL ROD THEREOF

TECHNICAL FIELD

The present invention relates to an auxiliary heating device, in particular to an auxiliary heating device for a zone melting furnace and a heat preservation method for a single crystal rod thereof.

BACKGROUND ART

Silicon is a basic material in the primary industry, namely the electronic information technology industry throughout the world and accounts for over 95% of the use amount of semiconductor materials in the world. Zone-melted silicon single crystals have the advantages of high purity, good uniformity, few defects and the like owning to its unique growth mode and are thus applicable to high-power semiconductor components. With vigorous development of the electric and electronic industry, various novel electric and electronic devices, such as SR silicon rectifiers, SCR silicon-controlled rectifiers, GTR giant transistors, GTO thyristors, SITH static inductive thyristors, IGBT insulated gate bipolar transistors, PIN ultrahigh voltage diodes, smart power devices and power IC (Integrated Circuit) have more active demands on large-diameter zone-melted silicon single crystals, and therefore, the large-diameter zone-melted silicon single crystals have a broad application field and a favorable development prospect. A float zone melting method is adopted for the growth of the zone-melted silicon single crystals, that is to say, polycrystalline rods are heated by adopting a high-frequency primary heating coil and are then molten, and the molten silicon is caught by seed crystals below the coil to continuously grow single crystal rods. By the adoption of float zone melting, the thermal field is concentrated near the melting zone, and the temperature distribution below the melting zone is not uniform. Especially for the growth of the large-diameter silicon single crystals, the surfaces of the single crystal rods are rapidly cooled, the radial temperature gradient of the center and the surface is enlarged, and thus the silicon single crystals are cracked. With the increase of the diameter of the single crystal rod, the melting zone area and the thermal stress are increased in a geometric level, and when the thermal stress of the single crystal rod is larger than its critical shear pressure, the single crystal rod shifts to cause broken ridges, and even rupture to further influence the production efficiency and damage equipment. In the existing technology, all large-diameter zone-melted single crystal silicon over 6.5 inches faces to the problem of single crystal rod cracking owing to unreasonable distribution of the thermal field and overlarge thermal stress, and broken ridges caused by unreasonable distribution of the thermal field and overlarge thermal stress in the growth process of 3-6 inch zone-melted single crystal silicon are one of the most major problems for improving the productivity of the silicon single crystals.

In the existing technology, in order to improve the distribution of the thermal field below a melting zone and enhance the quality of single crystal rods, a copper heat preservation ring device is often adopted (refer to FIG. 1). The copper heat preservation ring device can reflect heat irradiated from the melting zone to the surface of the silicon single crystal to play a certain heat preservation role in the single crystal rod below the melting zone. However, the copper heat preservation ring device can only reflect the heat irradiated from the melting zone passively, and thus the reflected heat is uncontrollable in size and position.

PRC (Disclosure) patents CN 102808216 A, CN102321913 A, CN102358951 A, CN202492612U and the like disclose a structure employing such heat preservation ring respectively, and different materials are also adopted for heat preservation in the disclosed technologies, however, these heat preservation mechanisms employ passive heat preservation and thus are inapplicable to growth of large-diameter zone-melted single crystal rods.

Hence, it is urgent to develop an active heat preservation device for a zone melting furnace so as to improve the distribution of the thermal field; and the temperature distribution of the single crystal rod needs to be accurately controlled according to technological demands so as to solve the cracking problem of the large-diameter single crystal rod and improve the quality of silicon single crystals.

SUMMARY

The present invention aims at solving the technical problem of providing an auxiliary heating device for a zone melting furnace and a method for carrying out active and controllable heat preservation on a single crystal rod below the melting zone, against the defects of the existing technology. In the present invention, the heating power of the auxiliary heating device can be adjusted in real time according to technologies, and the temperature distribution of the single crystal rod can be accurately controlled according to technological demands and are thus applicable to growth of single crystal rods different in diameter and crystal orientation. The following technical solutions are employed in order to solve said technical problem:

an auxiliary heating device for a zone melting furnace is provided, comprising an auxiliary heater disposed below a primary heating coil in the zone melting furnace; the auxiliary heater is formed by winding a hollow metal circular pipe according to a spiral line type; the winding start end of the auxiliary heater is positioned on the upper part, the winding stop end of the auxiliary heater is positioned on the lower part, and an upper end part and a lower end part are horizontally guided out from the both ends, respectively; a hollow cylindrical heating load which is axially symmetric is disposed on the inner side of the auxiliary heater, and a hollow cylindrical insulation part is disposed between the heating load and the auxiliary heater; the auxiliary heating device also comprises hollow tubular electrodes each of which one end is provided with a water inlet and the other end is respectively connected with the upper end part and the lower end part of the auxiliary heater through metal sealing joints; a cable connecting plate is welded to the side edge of each electrode and is connected with a power control cabinet through a water-cooled cable; and the power control cabinet is also sequentially connected with a data analysis module and an infrared temperature measuring instrument through signal lines.

As an improvement, the auxiliary heating device also comprises a support consisting of a vertical plate, support arms and support rings; wherein, the vertical plate is provided with two parallel vertical elongated slots, two triangular support arms are symmetrically arranged in the elongated slots, and the support rings horizontally placed are welded to the support arms; a fixed arm is fixedly connected to the vertical plate, opposite to the support arms, by means of screws and is fixed on the furnace wall of the zone melting furnace; the upper edge of each insulation part and the upper edge of the heating load are respectively provided with a flange extending outwards, wherein the flange of the heating load is lapped to the flanges of the insulation parts, and the flanges of the insulation parts are lapped to the support rings.

As an improvement, the upper end part and the lower end part of the auxiliary heater are positioned on the same side.

As an improvement, the heating load is made of industrially pure iron or carbon steel, wherein the vertical section thereof is axially symmetrical and is shaped as a rectangle or an isosceles trapezoid, or other shapes with parallel upper and lower bottom edges and parabolic side edges; and the absorption power of the heating load meets the following formula:

$$P = \pi^2 I^2 \left( \frac{1.35 * D1 * N}{H1} e^{\frac{-2\pi\delta 1}{c*\rho 1}\sqrt{\mu*f}} + \frac{0.75 * D2 * H2}{H1^2} e^{\frac{-2\pi\delta 2}{c*\rho 2}\sqrt{\mu*f}} \right)$$

in this formula, P is the absorption power, I is the current applied to the auxiliary heater, μ is the vacuum magnetic permeability, c is the velocity of light under a vacuum state, f is the frequency of the current in the auxiliary heater, N is the number of turns of the auxiliary heater, D1 is the average diameter of the auxiliary heater, H1 is the height of the auxiliary heater, ρ1 is the resistivity of the auxiliary heater, δ1 is the section wall thickness of the auxiliary heater, D2 is the average diameter of the heating load, H2 is the height of the heating load, ρ2 is the resistivity of the heating load, and δ2 is the average thickness of the heating load.

As an improvement, the hollow metal circular pipe for winding the auxiliary heater is made of pure copper or pure silver; the insulation parts are made of ceramic or quartz and have the shapes matched with the heating load, and the outer wall of each insulation part is provided with a spiral groove adaptive to the auxiliary heater.

As an improvement, the power control cabinet is equipped with a high-frequency filter circuit, a power adjusting circuit and a power feedback circuit.

Further, the present invention also provides a heat preservation method for a single crystal rod on the basis of the forementioned auxiliary heating device, wherein an alternating current is applied to the auxiliary heater by means of the power control cabinet to generate eddy current and heat in the heating load, the heating load applies thermal irradiation and thermal reflection to the single crystal rod growing therein, and thus the heat preservation to the single crystal rod is realized; an infrared temperature measuring instrument is configured to monitor the temperature of a specific point of the single crystal rod in real time and transmit the temperature to the data analysis module, and the data analysis module is configured to control the current of the auxiliary heater by virtue of built-in control methods, so as to adjust the heat of the heating load and further adjust a heat preservation effect on the single crystal rod; with regard to the control methods built in the data analysis module, a control target refers to the temperature of the specific point of the single crystal rod, the control input refers to the current of the auxiliary heater, and in addition, different control strategies are adopted in different growth stages, specifically comprising:

in a shoulder expanding stage, the diameter of the single crystal rod changes continuously, and a change curve T(d) of the temperature of the specific point of the single crystal rod along with the diameter of the single crystal rod is set as a target value, wherein the change curve T(d) of the temperature of the specific point of the single crystal rod along with the diameter of the single crystal rod is obtained in a manner of calibrating a production process of the single crystal rod as a standard reference; when the diameter of the single crystal rod is D, the target value T(D) of the temperature of the single crystal rod is obtained through looking up the curve, and temperature deviation $\Delta T = T1 - T(D)$, wherein T1 is the temperature, detected by the infrared temperature measuring instrument, of the specific point of the single crystal rod when the diameter of the single crystal rod is D;

a current set value I of the auxiliary heater is controlled in three stages: when the temperature deviation $\Delta T < Tm$, I=Imax, namely the auxiliary heater outputs the maximum current; when $\Delta T > Tb$, I=0, namely the auxiliary heater is switched off; when $Tm \leq \Delta T \leq Tb$, I=I0−0.45×$\Delta T$+0.0038×(D/$\Delta T$), wherein Tm is a lower deviation allowed when the target value of the temperature of the single crystal rod is T(D), Tb is an upper deviation allowed when the target value of the temperature of the single crystal rod is T(D), both of which meet −20° C.≤Tm≤0° C.≤Tb≤20° C., and I0 is an initial set value of the current of the auxiliary heater in the shoulder expanding stage and ranges from 0.3 Imax to 0.5 Imax;

in an equal diameter stage, the current set value I of the auxiliary heater is I1+0.05×T, wherein I1 is an initial set value of the current of the auxiliary heater in the equal diameter stage and ranges from 0.4 Imax to 0.7 Imax, and T is time entering the equal diameter stage;

in an ending stage, a change curve T(d)' of the temperature of the specific point of the single crystal rod along with the diameter of the single crystal rod is set as a target value, wherein the change curve T(d)' of the temperature of the specific point of the single crystal rod along with the diameter of the single crystal rod is obtained in a manner of calibrating the production process of the single crystal rod as a standard reference; and when the diameter of the single crystal rod is D, the target value T(D)' of the temperature of the single crystal rod is obtained by looking up the curve, and temperature deviation $\Delta T = T1' - T(D)'$, wherein the T1' is the temperature, detected by the infrared temperature measuring instrument, of the specific point of the single crystal rod when the diameter of the single crystal rod is D; and the current set value I of the auxiliary heater is controlled in three stages: when the temperature deviation $\Delta T' < Tm'$, I=Imax, namely the auxiliary heater outputs the maximum current; when $\Delta T' > Tb'$, I=0, namely the auxiliary heater is switched off; when $Tm' \leq \Delta T' \leq Tb'$, I=I0'−0.65×$\Delta T'$+0.0025×(D/$\Delta T'$), wherein Tm' is a lower deviation allowed when the target value of the temperature of the single crystal rod is T(D)', Tb' is an upper deviation allowed when the target value of the temperature of the single crystal rod is T(D)', both of which meet −20° C.≤Tm'≤0<Tb'≤20° C., and I0' is an initial set value of the current of the auxiliary heater in the ending stage and ranges from 0.3 Imax to 0.5 Imax.

Compared with the existing technology, the present invention has the beneficial effects as below:

an inductive heating principle is adopted in the present invention, to be specific, an alternating current is introduced to the auxiliary heater to generate the eddy current in the heating load and then the heating load is heated, the heating load applies thermal irradiation and thermal reflection to the single crystal rod to change the thermal field distribution of the single crystal rod, and thus heat preservation to the single crystal rod is realized. The infrared temperature measuring instrument is configured to monitor the temperature of the specific point of the single crystal rod in real time and transmit the temperature to the data analysis module, and the data analysis module is configured to control the current of the auxiliary heater by virtue of a certain control method so as to adjust the heat of the heating load and further adjust the heat preservation effect on the single crystal rod and accurately control the thermal field distribution of the single crystal rod. The high-frequency filter circuit in the power control cabinet can effectively avoid the interference from a high-frequency power supply and realize accurate control. The metal sealing joints are adopted between the electrodes and the auxiliary heater, and thus the electrodes and the auxiliary heater are convenient to disassemble and assemble and good in sealing property. In the meantime, the thermal field distribution can be adjusted by adjusting the height of a coil support, the size of the auxiliary heater and the size of the heating load so as to be applicable to different silicon single crystal growth requirements. The present invention can solve the problem of single crystal rod cracking caused by unreasonable distribution of the thermal field and overlarge thermal stress in the growth process of the large-diameter zone-melted silicon single crystals over 6.5 inches, and simultaneously can improve the thermal field distribution in the growth process of 3-6 inch zone-melted silicon single crystals, solve the problem of broken ridges caused by unreasonable distribution of the thermal field and overlarge thermal stress, improve the productivity of the silicon single crystals to over 85% from 70% in the existing technology and enhance the quality of the silicon single crystals.

BRIEF DESCRIPTION OF THE ATTACHED DRAWINGS

Figure 2:
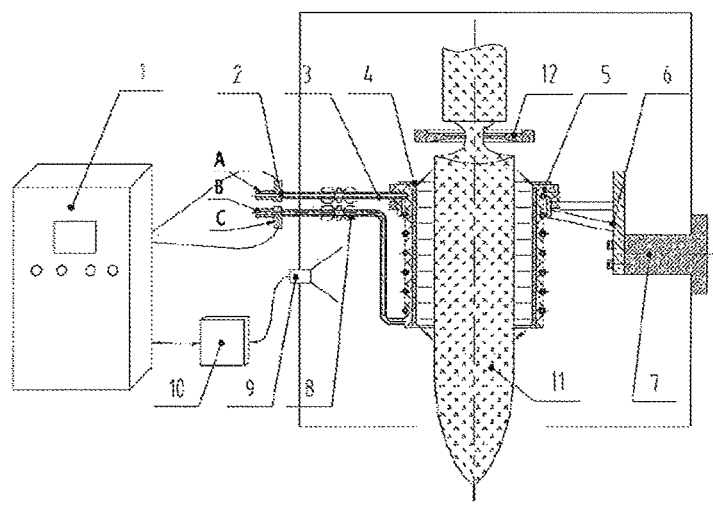
Figure 3:
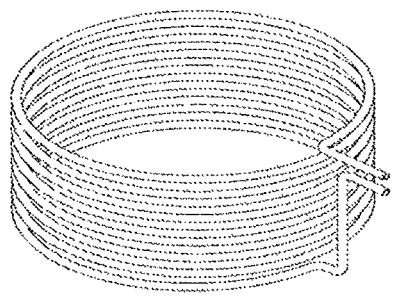
Figure 4:
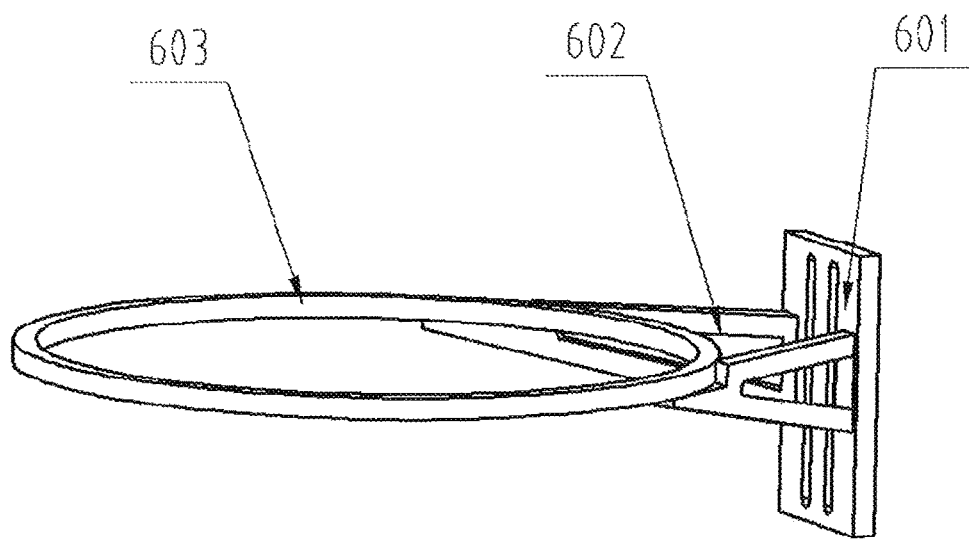

FIG. 1 is a heat preservation device for a single crystal rod of the traditional technology.
FIG. 2 is an overall structure diagram of one embodiment of the present invention.
FIG. 3 is a schematic diagram of the auxiliary heater of one embodiment of the present invention.
FIG. 4 is a structural schematic diagram of the support of one embodiment of the present invention.
In the attached drawings, the power control cabinet 1, the electrode 2, the auxiliary heater 3, the heating load 4, the insulation part 5, the support 6, the fixed arm 7, the joint 8, the infrared temperature measuring instrument 9, the data analysis module 10, the single crystal rod 11, the primary heating coil 12, the heat preservation ring 13, a water inlet A of the electrodes, a water outlet B of the electrodes, the cable connecting plate C, the vertical plate 601, the support arm 602 and the support ring 603 are marked.

OPTIMAL EMBODIMENTS OF THE PRESENT INVENTION

It needs to be first illustrated that the application of an automatic control technology and a computer technology will be involved in the realization process of the present invention. The applicant holds that the present invention can be realized completely after reading the application document carefully and accurately understanding the realization principle and the invention objective of the present invention. For example, the data analysis module 10 can employ a PLC with an optional model CJ2M produced by OMRON. Those skilled in the art can finish built-in control software by applying their software programming skills on the premise of combining the existing widely-known technologies. Therefore, all contents mentioned by the application document of the present invention belong to this category, and the applicant will not enumerate one by one.

The present invention will be further described in detail as below in conjunction with the attached drawing and the specific embodiments:

As shown in FIG. 2 and FIG. 3, the auxiliary heating device for the zone melting furnace comprises a power control cabinet 1, electrodes 2, an auxiliary heater 3, a heating load 4, insulation parts 5, a support 6, a fixed aim 7, joints 8, an infrared temperature measuring instrument 9 and a data analysis module 10.

The auxiliary heater 3 is formed by winding a hollow circular pipe made of pure copper or pure silver according to a spiral line type, wherein the number of turns is not less than 1 and the inner diameter is 100-500 mm; one section of the upper end of the auxiliary heater 3 is horizontally guided out from the winding start end of the coil at 90 degrees, and the lower end and the upper end of the auxiliary heater are parallel and are positioned on the same tangent plane; one end of each of the two electrodes is provided with a pagoda-shaped water nozzle, and the two water nozzles act as a water inlet A and a water outlet B of the auxiliary heater and the electrodes; a cable connecting plate C is welded to the side edge of said end, where the pagoda-shaped water nozzle is formed, of each of the electrodes 2, and the cable connecting plates C are connected with the power control cabinet 1 through water-cooled cables; the other end of each electrode 2 is equipped with a circular pipe which is the same as the auxiliary heater 3, and the circular pipes are respectively connected with a winding start port and a winding stop port of the auxiliary heater 3 through the joints 8. Cooling water in the auxiliary heater 3 is mainly used for cooling the auxiliary heater 3 to prevent the auxiliary heater 3 from being damaged owing to overheating. In this embodiment, the temperature of a cooling water outlet of the auxiliary heater 3 is controlled between 35° C. and 45° C.

The heating load 4 is disposed inside the auxiliary heater 3 which is arranged on the support 6, wherein the support 6 is fixed with the furnace wall through the fixed arm 7. The heating load is made of industrially pure iron or carbon steel, and its vertical section is axially symmetrical, and is shaped as a rectangle or an isosceles trapezoid, or other shapes with parallel upper and lower bottom edges and parabolic side edges; and the absorption power of the heating load meets the following formula:

$$P = \pi^2 I^2 \left( \frac{1.35 * D1 * N}{H1} e^{\frac{-2\pi\delta 1}{c*\rho 1}\sqrt{\mu * f}} + \frac{0.75 * D2 * H2}{H1^2} e^{\frac{-2\pi\delta 2}{c*\rho 2}\sqrt{\mu * f}} \right)$$

in this formula, P is the absorption power, I is the current applied to the auxiliary heater, μ is the vacuum magnetic permeability, c is the velocity of light under a vacuum state, f is the frequency of the current in the auxiliary heater, N is the number of turns of the auxiliary heater, D1 is the average diameter of the auxiliary heater, H1 is the height of the auxiliary heater, ρ1 is the resistivity of the auxiliary heater, δ1 is the section wall thickness of the auxiliary heater, D2 is the average diameter of the heating load, H2 is the height of the heating load, ρ2 is the resistivity of the heating load and δ2 is the average thickness of the heating load.

In the present invention, the frequency of the current applied to the auxiliary heater is 200 Hz-1000 Hz.

The insulation parts 5 are respectively arranged among the auxiliary heater 3, the support 6 and the heating load 4, are shaped as cylinders with edges and are made of ceramic or quartz, wherein the outer wall of each insulation part 5 is provided with a spiral groove adaptive to the auxiliary heater 3; the heating load 4 is axially symmetrical, and its vertical section is shaped as a rectangle or an isosceles trapezoid, or other shapes with parallel upper and lower bottom edges and parabolic side edges, wherein the upper end of the heating load 4 is provided with a flange and is made of industrially pure iron or carbon steel.

As shown in FIG. 4, the support 6 comprises a vertical plate 601, support aims 602 and support rings 603; the vertical plate 601 is provided with elongated slots, and two triangular support arms 602 are obliquely disposed on the flange of the vertical plate 601 in a central symmetry manner, and the annular support rings 603 horizontally placed are welded to the support arms 602. The support 6 plays a role of supporting the auxiliary heater 3 and the heating load 4. Fixed screws of the support 6 and the fixed arms 7 penetrate through the elongated slots of the vertical plate, the height of the support 6 is adjusted by adjusting the positions of the fixed screws, and thus the relative positions of the auxiliary heater 3 as well as the heating load 4 and the single crystal rod 11 are adjusted to further change the thermal field distribution and the heat preservation effect of the single crystal rod 11.

The infrared temperature measuring instrument 9 is arranged on the furnace wall and the data analysis module 10 is arranged outside a furnace chamber; the joints 8 are ferrule type or VCR metal sealing joints; and the power control cabinet is equipped with a high-frequency filter circuit, a power adjusting circuit and a power feedback circuit, wherein the high-frequency filter circuit can be configured to effectively avoid the interference from a high-frequency power supply.

According to a heat preservation method for the single crystal rod employing the auxiliary heating device, the infrared temperature measuring instrument 9 and the data analysis module 10 are comprised, wherein a certain frequency of alternating current is applied to the auxiliary heater 3 through the power control cabinet 1 to generate eddy current and heat in the heating load 4, the heating load 4 applies thermal irradiation and thermal reflection to the single crystal rod 11 growing therein, and thus heat preservation to the single crystal rod 11 is realized; the infrared temperature measuring instrument 9 is configured to monitor the temperature of the specific point of the single crystal rod 11 in real time and transmit the temperature to the data analysis module 10, and the data analysis module 10 is configured to control the current of the auxiliary heater 3 through built-in control methods, so as to adjust the heat of the heating load 4 to further accurately control the temperature distribution of the single crystal rod 11 and adjust the heat preservation effect on the single crystal rod 11.

The zone-melted silicon single crystal growth mainly comprises the stages, such as seeding, shoulder expanding, equal diameter and ending; the built-in control methods in the data analysis module 10 mainly play a role in the shoulder expanding, equal diameter and ending stages, and its control target refers to the temperature of the specific point of the single crystal rod 11; and the control input refers to the current of the auxiliary heater 3, and different control methods are employed in different growth stages.

In the shoulder expanding stage, the diameter of the single crystal rod 11 continuously changes, and the change curve T(d) of the temperature of the specific point of the single crystal rod 11 along with the diameter of the single crystal rod 11 is set as a target value, wherein the change curve T(d) of the temperature of the specific point of the single crystal rod 11 along with the diameter of the single crystal rod 11 is obtained in a manner of calibrating the production process of the single crystal rod 11 as a standard reference; and when the diameter of the single crystal rod 11 is D, the target value T(D) of the temperature of the single crystal rod 11 is obtained through looking up the curve, and temperature deviation $\Delta T=T1-T(D)$, wherein T1 is the temperature, detected by the infrared temperature measuring instrument 9, of the specific point of the single crystal rod 11 when the diameter of the single crystal rod 11 is D.

The current set value I of the auxiliary heater 3 is controlled in three stages: when the temperature deviation $\Delta T<Tm$, I=Imax, namely the auxiliary heater 3 outputs the maximum current; when $\Delta T>Tb$, I=0, namely the auxiliary heater 3 is switched off; when $Tm \leq \Delta T \leq Tb$, $I=I0-0.45 \times \Delta T+ 0.0038 \times (D/\Delta T)$, wherein Tm is a lower deviation allowed when the target value of the temperature of the single crystal rod 11 is T(D), Tb is an upper deviation allowed when the target value of the temperature of the single crystal rod 11 is T(D), both of which meet $-20°$ C.$\leq Tm \leq 0 \leq Tb \leq 20°$ C., and I0 is an initial set value of the current of the auxiliary heater 3 in the shoulder expanding stage and ranges from 0.3 Imax to 0.5 Imax.

In the equal diameter stage, the primary heating power is kept stable basically since the diameter of the single crystal rod 11 is not changed any more, and the current set value I of the auxiliary heater 3 is $I1+0.05 \times T$, wherein I1 is an initial set value of the current of the auxiliary heater 3 in the equal diameter stage and ranges from 0.4 Imax to 0.7 Imax, and T is time entering the equal diameter stage;

in the ending stage, a change curve T(d)' of the temperature of the specific point of the single crystal rod 11 along with the diameter of the single crystal rod 11 is set as a target value, wherein the change curve T(d)' of the temperature of the specific point of the single crystal rod 11 along with the diameter of the single crystal rod 11 is obtained in a manner of calibrating the production process of the single crystal rod 11 as a standard reference; and when the diameter of the single crystal rod 11 is D, the target value T(D)' of the temperature of the single crystal rod 11 is obtained through looking up the curve, and temperature deviation $\Delta T=T1'-T(D)'$, wherein the T1' is the temperature, detected by the infrared temperature measuring instrument 9, of the specific point of the single crystal rod 11 when the diameter of the single crystal rod 11 is D; and the current set value I of the auxiliary heater 3 is controlled in three stages: when the temperature deviation $\Delta T' \leq Tm'$, I=Imax, namely the auxiliary heater 3 outputs the maximum current; when $\Delta T'>Tb'$, I=0, namely the auxiliary heater 3 is switched off; when $Tm' \leq \Delta T' \leq Tb'$, $I=I0'-0.65 \times \Delta T'+0.0025 \times (D/\Delta T')$, wherein Tm' is a lower deviation allowed when the target value of the temperature of the single crystal rod 11 is T(D)', Tb' is an upper deviation allowed when the target value of the temperature of the single crystal rod 11 is T(D)', both of which meet $-20 \square \leq Tm' \leq 0 \square \leq Tb' \leq 20 \square$, and I0' is an initial set value of the current of the auxiliary heater 3 in the ending stage and ranges from 0.3 Imax to 0.5 Imax.

In the silicon single crystal production of the zone melting furnace, the same joints are employed for the auxiliary heater 3 and the heating load 4 which are different in number of turns and inner diameter, and are capable of meeting the requirements of production of silicon single crystals different in diameter and quality. In the substitute production of single crystal rod products different in diameter or crystal orientation, the present invention can meet the requirements through the manners of adjusting the technological parameters, adjusting the height of the support 6, replacing the auxiliary heater 3 or the heating load 4, and the like.

It is worth noting that the auxiliary heating device in the present invention also can be combined with a heat preservation ring 13 in FIG. 1.

Of course, the contents as above mentioned are just preferable embodiments of the present invention, and it should notice that a plurality of improvements and polishes made by common technical personnel in the art on the premise of not departing from the technical theory of the present invention should fall into the protection scope of the present invention.

INDUSTRIAL APPLICABILITY

The present invention can solve the problem of single crystal rod cracking caused by unreasonable distribution of the thermal field and overlarge thermal stress caused in the growth process of the large-diameter zone-melted silicon single crystals over 6.5 inches, and simultaneously can improve the thermal field distribution in the growth process of the 3-6 inch zone-melted silicon single crystals, solve the problem of broken ridges caused by unreasonable distribution of the thermal field and overlarge thermal stress, improve the productivity of the silicon single crystals to over 85% from 70% of the existing technology and enhance the quality of the silicon single crystals.

The invention claimed is:

1. An auxiliary heating device for a zone melting furnace, comprising:
   an auxiliary heater disposed below a primary heating coil in the zone melting furnace,
   wherein said auxiliary heater is formed by winding a hollow metal circular pipe according to a spiral line type,
   the winding start end of the auxiliary heater is positioned on the upper part,
   the winding stop end thereof is positioned on the lower part,
   an upper end part and a lower end part are horizontally guided out from the both ends respectively,
   a hollow cylindrical heating load which is axially symmetrical is disposed on the inner side of the auxiliary heater,
   a hollow cylindrical electrical insulation part is disposed between the heating load and the auxiliary heater,
   the device also comprises hollow tubular electrodes each of which one end is provided with a water inlet and the other end is connected with the upper end part and the lower end part of the auxiliary heater respectively through metal sealing joints,
   a cable connecting plate is welded to the side edge of each electrode and is connected with the power control cabinet through a water-cooled cable,
   the power control cabinet is sequentially connected with a data analysis module and an infrared temperature measuring instrument through signal lines,
   the auxiliary heater is independent of the primary heating coil,
   when an alternating current is applied to the auxiliary heater through the power control cabinet, the auxiliary heater is configured to generate eddy current in the heating load to heat the heating load, and
   the heating load is configured to apply thermal irradiation and thermal reflection to preserve heat.

2. The auxiliary heating device according to claim 1, wherein it also comprises a support consisting of a vertical plate, support arms and supporting rings; wherein the vertical plate is provided with two parallel vertical elongated slots, the two triangular support arms are symmetrically arranged in the elongated slots and the support rings placed horizontally are welded to the support arms; a fixed arm is fixedly connected to the vertical plate, opposite to the support arms, through screws, and is fixed on the furnace wall of the zone melting furnace; and the upper edge of said insulation part and said heating load are provided with a flange extending outwards, respectively, wherein the flange of the heating load is lapped to the flange of the insulation part, and the flange of the insulation part is lapped to the support rings.

3. The auxiliary heating device according to claim 1, wherein the upper end part and the lower end part of said auxiliary heater are positioned on the same side.

4. An auxiliary heating device for a zone melting furnace, comprising an auxiliary heater disposed below a primary heating coil in the zone melting furnace, said auxiliary heater is formed by winding a hollow metal circular pipe according to a spiral line type; the winding start end of the auxiliary heater is positioned on the upper part, the winding stop end thereof is positioned on the lower part, and an upper end part and a lower end part are horizontally guided out from the both ends respectively; a hollow cylindrical heating load which is axially symmetrical is disposed on the inner side of the auxiliary heater, and a hollow cylindrical insulation part is disposed between the heating load and the auxiliary heater; and
   the device also comprises hollow tubular electrodes each of which one end is provided with a water inlet and the other end is connected with the upper end part and the lower end part of the auxiliary heater respectively through metal sealing joints; a cable connecting plate is welded to the side edge of each electrode and is connected with the power control cabinet through a water-cooled cable; and the power control cabinet is sequentially connected with a data analysis module and an infrared temperature measuring instrument through signal lines,
   wherein said heating load is made of industrially pure iron or carbon steel, and its vertical section is axially symmetrical, and is shaped as a rectangle or an isosceles trapezoid, or other shapes with parallel upper and lower bottom edges and parabolic side edges; and the absorption power of the heating load meets the following formula:

$$P = \pi^2 I^2 \left( \frac{1.35 * D1 * N}{H1} e^{\frac{-2\pi\delta 1}{c*\rho 1}\sqrt{\mu*f}} + \frac{0.75 * D2 * H2}{H1^2} e^{\frac{-2\pi\delta 2}{c*\rho 2}\sqrt{\mu*f}} \right)$$

in this formula, P is the absorption power, I is the current applied to the auxiliary heater, μ is the vacuum magnetic permeability, c is the velocity of light under a vacuum state, f is the frequency of the current in the auxiliary heater, N is the number of turns of the auxiliary heater, D1 is the average diameter of the auxiliary heater, H1 is the height of the auxiliary heater, ρ1 is the resistivity of the auxiliary heater, δ1 is the section wall thickness of the auxiliary heater, D2 is the average diameter of the heating load, H2 is the height of the heating load, ρ2 is the resistivity of the heating load, and the δ2 is the average thickness of the heating load.

5. The auxiliary heating device according to claim 1, wherein the hollow metal circular pipe for winding said auxiliary heater is made of pure copper or pure silver; and said insulation part is made of ceramic or quartz and has the shape matched with the heating load, wherein the outer wall of the insulation part is provided with a spiral groove adaptive to the auxiliary heater.

6. The auxiliary heating device according to claim 4, wherein said power control cabinet is provided with a high-frequency filter circuit, a power adjusting circuit and a power feedback circuit.

7. A heat preservation method for manufacturing a single crystal by using said auxiliary heating device according to claim 1, wherein an alternating current is applied to the auxiliary heater through the power control cabinet to generate eddy current and heat in the heating load, the heating load applies thermal irradiation and thermal reflection to the single crystal rod therein to achieve heat preservation of the single crystal rod; the infrared temperature measuring instrument is configured to monitor the temperature of the specific point of the single crystal rod in real time and transmit the temperature to the data analysis module, and the data analysis module is configured to control the current of the auxiliary heater through built-in control methods, so as to adjust the heat of the heating load to further adjust the heat preservation effect on the single crystal rod; according to the control methods built in the data analysis module, a control target refers to the temperature of the specific point of the single crystal rod, the control input refers to the current of the auxiliary heater, and different control categories are employed in different growth stages, specifically comprising: in a shoulder expanding stage, the diameter of the single crystal rod changes continuously, and a change curve $T(d)$ of the temperature of the specific point of the single crystal rod along with the diameter of the single crystal rod is set as a target value, wherein the change curve $T(d)$ of the temperature of the specific point of the single crystal rod along with the diameter of the single crystal rod is obtained in a manner of calibrating a production process of the single crystal rod as a standard reference; when the diameter of the single crystal rod is D, the target value $T(D)$ of the temperature of the single crystal rod is obtained through looking up the curve, and temperature deviation $\Delta T=T1-T(D)$, wherein T1 is the temperature, detected by the infrared temperature measuring instrument, of the specific point of the single crystal rod when the diameter of the single crystal rod is D; a current set value I of the auxiliary heater is controlled in three stages: when the temperature deviation $\Delta T<Tm$, I=Imax, the auxiliary heater outputs the maximum current; when $\Delta T>Tb$, I=0, the auxiliary heater is switched off, when $Tm \leq \Delta T \leq Tb$, $I=I0-0.45 \times \Delta T+0.0038 \times (D/\Delta T)$, wherein Tm is a lower deviation allowed when the target value of the temperature of the single crystal rod is $T(D)$, Tb is an upper deviation allowed when the target value of the temperature of the single crystal rod is $T(D)$, both of which meet $-20°C. \leq Tm \leq 0°C. \leq Tb \leq 20°C.$, and I0 is an initial set value of the current of the auxiliary heater in the shoulder expanding stage and ranges from 0.3 Imax to 0.5 Imax; in an equal diameter stage, the current set value I of the auxiliary heater is $I1+0.05 \times T$, wherein I1 is an initial set value of the current of the auxiliary heater in the equal diameter stage and ranges from 0.4 Imax to 0.7 Imax, and T is time entering the equal diameter stage; in an ending stage, a change curve $T(d)'$ of the temperature of the specific point of the single crystal rod along with the diameter of the single crystal rod is set as a target value, wherein the change curve $T(d)'$ of the temperature of the specific point of the single crystal rod along with the diameter of the single crystal rod is obtained in a manner of calibrating the production process of the single crystal rod as a standard reference; and when the diameter of the single crystal rod is D, the target value $T(D)'$ of the temperature of the single crystal rod is obtained through looking up the curve, and temperature deviation $\Delta T=T1'-T(D)'$, wherein the T1' is the temperature, detected by the infrared temperature measuring instrument, of the specific point of the single crystal rod when the diameter of the single crystal rod is D; and a current set value I of the auxiliary heater is controlled in three stages: when the temperature deviation $\Delta T'<Tm'$, I=Imax, the auxiliary heater outputs the maximum current; when $\Delta T'>Tb'$, I=0, the auxiliary heater is switched off, when $Tm' \leq \Delta T' \leq Tb'$, $I=I0'-0.65 \times \Delta T'+0.0025 \times (D/\Delta T')$, wherein Tm' is a lower deviation allowed when the target value of the temperature of the single crystal rod is $T(D)'$, Tb' is an upper deviation allowed when the target value of the temperature of the single crystal rod is $T(D)'$, both of which meet $-20°C. \leq Tm' \leq ° C. \leq Tb' \leq 20°C.$, and I0' is an initial set value of the current of the auxiliary heater in the ending stage and ranges from 0.3 Imax to 0.5 Imax.

* * * * *